United States Patent
Kojima (10) Patent No.: US 9,153,752 B2
(45) Date of Patent: Oct. 6, 2015

(54) METHOD OF MANUFACTURING LIGHT-EMITTING DEVICE

(75) Inventor: Takeshi Kojima, Hachioji (JP)

(73) Assignee: KONICA MINOLTA ADVANCED LAYERS, INC., Tokyo (JP)

( * ) Notice: Subject to any disclaimer, the term of this patent is extended or adjusted under 35 U.S.C. 154(b) by 0 days.

(21) Appl. No.: 13/817,320

(22) PCT Filed: Aug. 2, 2011

(86) PCT No.: PCT/JP2011/067634
§ 371 (c)(1),
(2), (4) Date: Feb. 15, 2013

(87) PCT Pub. No.: WO2012/023424
PCT Pub. Date: Feb. 23, 2012

(65) Prior Publication Data
US 2013/0143343 A1    Jun. 6, 2013

(30) Foreign Application Priority Data
Aug. 17, 2010 (JP) ................. 2010-182211

(51) Int. Cl.
*H01L 21/00* (2006.01)
*H01L 33/50* (2010.01)
*H01L 33/52* (2010.01)
*H01L 21/66* (2006.01)
(Continued)

(52) U.S. Cl.
CPC ............. *H01L 33/502* (2013.01); *H01L 22/10* (2013.01); *H01L 33/005* (2013.01); *H01L 33/50* (2013.01); *H01L 33/52* (2013.01); *H01L 33/56* (2013.01); *H01L 2933/0041* (2013.01)

(58) Field of Classification Search
USPC ............. 438/29, 82, 99; 257/79–100; 347/22, 347/29, 30, 87
See application file for complete search history.

(56) References Cited

U.S. PATENT DOCUMENTS 6,789,874 B1 *  9/2004  Dietl ............................... 347/22
7,390,684 B2 *  6/2008  Izuno et al. ..................... 438/29

FOREIGN PATENT DOCUMENTS

CN    101296982    10/2008
CN    101679861     3/2010
(Continued)

OTHER PUBLICATIONS

Chinese Office Action, Application No. 201180040060.0, Issuing Date: Feb. 18, 2014 (5 pages).
(Continued)

*Primary Examiner* — Reema Patel
*Assistant Examiner* — Syed Gheyas
(74) *Attorney, Agent, or Firm* — Lucas & Mercanti, LLP (57) ABSTRACT

A method of manufacturing a light-emitting device including a light-emitting element which emits light with a predetermined wavelength and a wavelength conversion portion including a fluorescent substance which is excited by the light emitted from the light-emitting element to emit fluorescence with a wavelength different from the predetermined wavelength, includes the followings. First, spraying so as to apply a liquid mixture containing a layered silicate mineral and a translucent ceramic precursor on the light-emitting element from a nozzle is performed while the nozzle is moved relative to the light-emitting element. Subsequently, forming of the wavelength conversion portion by heating the sprayed and applied liquid mixture is performed.

17 Claims, 2 Drawing Sheets

(51) Int. Cl.
  *H01L 33/00* (2010.01)
  *H01L 33/56* (2010.01)

(56) References Cited

FOREIGN PATENT DOCUMENTS

| JP | 11-106685 A | | 4/1999 |
|---|---|---|---|
| JP | 11106685 A | * | 4/1999 |
| JP | 11-251640 A | | 9/1999 |
| JP | 2001-181614 A | | 7/2001 |
| JP | 2002-185046 A | | 6/2002 |
| JP | 2002-314142 A | | 10/2002 |
| JP | 2004-153109 A | | 5/2004 |
| JP | 2005-277127 A | | 10/2005 |
| JP | 2008-227458 A | | 9/2008 |
| JP | 2010-80588 A | | 9/2008 |
| JP | 4306224 | | 7/2009 |
| JP | 2009-256670 A | | 11/2009 |

OTHER PUBLICATIONS

English translation of Chinese Office Action, Application No. 201180040060.0, Issuing Date: Feb. 18, 2014 (5 pages).
Korean Office Action, Korean Patent Application No. 10-2013-7003657, mailing date: Mar. 20, 2014 (3 pages).
English translation of Korean Office Action, Korean Patent Application No. 10-2013-7003657, mailing date: Mar. 20, 2014 (3 pages).
Office Action mail dated Jan. 6, 2015 for the corresponding Japanese patent application No. 2012-529551 and its English translation.
Office Action mail dated Jun. 9, 2015 for the corresponding Japanese patent application No. 2013-129097.
An English translation of the Office Action mail dated Jun. 9, 2015 for the corresponding Japanese patent application No. 2013-129097.

* cited by examiner

METHOD OF MANUFACTURING LIGHT-EMITTING DEVICE

CROSS REFERENCE TO RELATED APPLICATION

This Application is a 371 of PCT/JP2011/067634 filed on Aug. 2, 2011, which claimed the priority of Japanese Patent Application No. 2010-182211 filed on Aug. 17, 2010, both applications are incorporated herein by reference in its entirety.

TECHNICAL FIELD

The present invention relates to a method of manufacturing a light-emitting device.

BACKGROUND ART

In recent years, there has been a widely-used technology for obtaining white LEDs by arranging a fluorescent substance such as a YAG fluorescent substance around gallium nitride (GaN) blue light-emitting diode (LED) chips to mix blue light emitted from the GaN blue LED chips and yellow light emitted by secondary light emission from the fluorescent substance which has received the blue light.

As for such white LEDs, it is commonly performed to seal LED chips or their mounting areas with a transparent resin dispersing a fluorescent substance therein. However, since specific gravity of a fluorescent substance is larger than a transparent resin, a fluorescent substance settles before the resin hardens, which causes color unevenness in light emission.

Given the above, there have been proposed a variety of methods for suppressing settlement of a fluorescent substance to avoid color unevenness. For example, Patent Document 1 discloses that settlement or segregation of a fluorescent substance can be suppressed by using a silicone resin as a sealant, which resin has a viscosity of from 100 to 1000 cP when it hardens. Further, Patent Document 2 discloses a chip-part type LED configured such that LED elements are arranged between the upper end opening and the bottom end opening of a cylindrical container, the cylindrical container is filled with a translucent resin from the upper end opening to the bottom end opening, and the inner face of the container is formed so as to reflect light emitted from the LED element to the upper end opening.

Still further, Patent Document 3 discloses a light-emitting device composed of a liquid translucent sealant material and a lipophilic compound added thereto as an anti-settlement agent, which compound prepared by adding organic cations to a layered compound mainly composed of a clay mineral, and discloses a manufacturing method thereof.

PRIOR ART DOCUMENTS

Patent Documents

Patent Document 1: Japanese Patent Application Publication No. 2002-314142.
Patent Document 2: Japanese Patent Application Publication No. 2002-185046.
Patent Document 3: Japanese Patent Application Publication No. 2004-153109.

SUMMARY OF THE INVENTION

Problem to be Solved by the Invention

In Patent Document 1, however, since LED chips are sealed with a silicone resin, deterioration of a sealant material such as coloration is easily developed by light emitted from the LED chips, heat generated by the LED chips and the fluorescent substance, and the like. Thus, it is difficult to achieve durability for a long-term use. Further, as for the configuration of Patent Document 2, the structure of LED is complex, which causes a cost increase. Still further, in Patent Documents 2 and 3, resin materials such as an epoxy resin, a silicone resin, and a polyimide resin are described as exemplary translucent sealant materials, but these resins are not adequate in terms of durability of a sealant material, like Patent Document 1.

Given the above, to improve heat and light durability of LED chips, LED chips can be sealed with a sealant material which is turned into ceramic after heated. In such a case, when the layered compound described in Patent Document 2 is added as a settlement inhibiting agent, a dispersed state of a fluorescent substance is stabilized. Thus, occurrence of color unevenness can be reduced. However, because viscosity of a liquid mixture of the sealant material and the settlement inhibiting agent is small, the fluorescent substance settles before the sealant material hardens, i.e., a settlement-suppressing effect is inefficient.

Therefore, a main purpose of the present invention is to provide a method of manufacturing a light-emitting device which includes a wavelength conversion portion where a fluorescent substance is dispersed evenly in a translucent material having a high heat durability.

Means for Solving the Problem

In order to solve the above problems, according to the present invention, there is provided a method of manufacturing a light-emitting device including a light-emitting element which emits light of a predetermined wavelength and a wavelength conversion portion including a fluorescent substance which is excited by the light emitted from the light-emitting element to emit (generate) fluorescence of a wavelength different from the predetermined wavelength, and the method includes spraying so as to apply a liquid mixture containing a layered silicate mineral and a translucent ceramic precursor on the light-emitting element from a nozzle while the nozzle is moved relative to the light-emitting element; and forming the wavelength conversion portion by heating the sprayed and applied liquid mixture.

Effect of the Invention

According to the present invention, the fluorescent substance can be applied on the light-emitting element in a well-dispersed state, because the liquid mixture containing the fluorescent substance, the layered silicate mineral, and the ceramic precursor is applied on the light-emitting element. Thus, the wavelength conversion portion where the fluorescent substance is evenly dispersed in the translucent material having a high heat durability can be formed.

EMBODIMENTS FOR CARRYING OUT THE INVENTION

Hereinafter, preferred embodiments of the present invention will be described with reference to the drawings.

Figure 1:
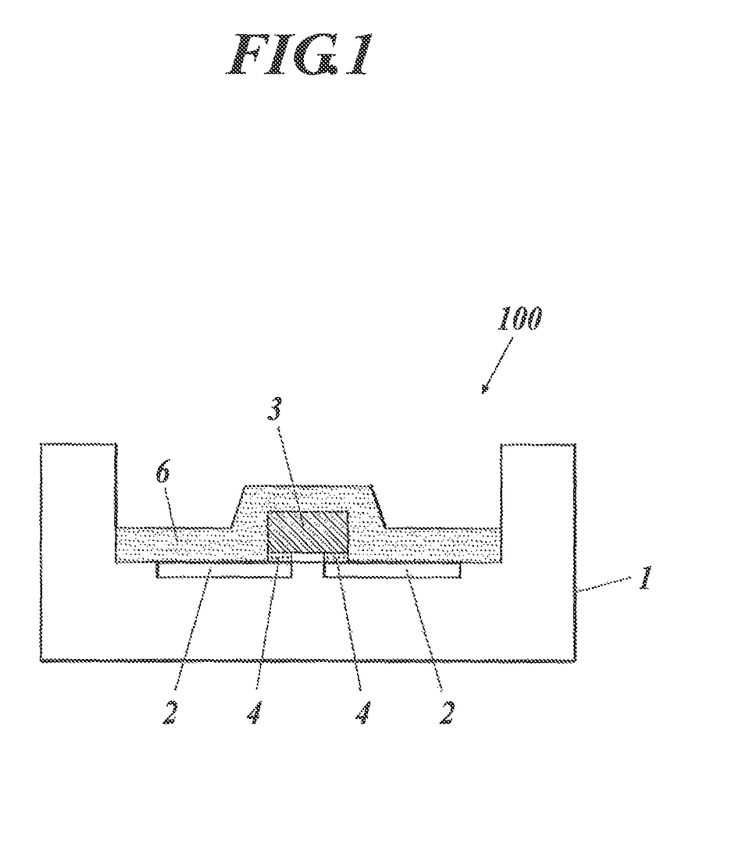
FIG. 1 This is a cross-sectional view illustrating a schematic configuration of a light-emitting device.

As illustrated in FIG. 1, a light-emitting device 100 has an LED substrate 1 whose cross-section is concave.

On a concave portion (the bottom portion) of the LED substrate 1, a metal portion 2 is arranged. Above the metal portion 2, an LED element 3 in a rectangular shape is arranged. The LED element 3 is an example of a light-emitting element which emits light of a predetermined wavelength.

On the surface of the LED element 3 facing to the metal portion 2, projecting electrodes 4 are arranged. The metal portion 2 and the LED element 3 are connected with each other through the projecting electrodes 4 (flip-chip type).

Although illustrated here is the configuration such that one LED element 3 is arranged on one LED substrate 1, a plurality of the LED elements 3 can be arranged on the concave portion of one LED substrate 1.

In this embodiment, a blue LED element is used as the LED element 3.

The blue LED element is, for example, constituted of a laminate of an n-GaN cladding layer, an InGaN fluorescent layer, a p-GaN cladding layer and a transparent electrode on a sapphire substrate.

On the concave portion of the LED substrate 1, a wavelength conversion portion 6 is formed so as to seal a surrounding area of the LED element 3.

The wavelength conversion portion 6 is a portion which converts light of a predetermined wavelength emitted from the LED element 3 to light of a wavelength different from the emitted light, and where a fluorescent substance which is excited with the wavelength from the LED element 3 and emits fluorescence of a wavelength different from the exciting wavelength is added in a translucent ceramic layer. Although the wavelength conversion portion 6 is formed so as to seal a surrounding area of the LED element 3 in this embodiment, the wavelength conversion portion 6 can be formed just around (on the upper and the side faces of) the LED element 3, and thus there can be a configuration such that the wavelength conversion portion 6 is not formed on the concave portion of the LED substrate 1.

As for a method of forming the wavelength conversion portion 6 just around the LED element 3, an available method is, for example, placing a mask when the wavelength conversion portion 6 is formed.

Next, a configuration of the wavelength conversion portion 6 and the like will be described in detail.

The wavelength conversion portion 6 is a clear ceramic layer (glass body) formed by turning a sol liquid mixture where an organometallic compound is mixed with an organic solvent into a gel by heating followed by firing, which is called the sol-gel method. The clear ceramic layer includes the fluorescent substance, the layered silicate mineral, and inorganic fine particles.

(Organometallic Compound)

The organometallic compound functions as a binder for sealing the fluorescent substance, the layered silicate mineral, and the inorganic fine particles.

As for the organometallic compound used in the present invention, such as a metal alkoxide, a metal acetylacetonate, a metal carboxylate can be given as the examples. A metal alkoxide, which is easily turned into a gel by hydrolysis and polymerization, is suitable.

A metal alcoxide can be monomolecular such as tetraethoxysilane, or can be a polysiloxane constituted of a chain or a ring of organosiloxane compounds. A polysiloxane which increases viscosity of the liquid mixture is suitable.

Types of metals of a metal alkoxide are not limited as long as a translucent glass body can be formed. Preferably, in terms of stability of a formed glass body and easiness of manufacturing thereof, silicon is included in a metal alkoxide. A plurality types of metals can be included therein.

If a content of the organometallic compound in the ceramic layer is less than 2% by weight, an amount of the organic compound as a binder is so low that strength of the ceramic layer after heated and fired decreases.

On the other hand, if the content of the organometallic compound in the ceramic layer is more than 50% by weight, a content of the layered silicate mineral become relatively low, and thus viscosity of the liquid mixture decrease and settlement of the fluorescent substance may easily occurs. In addition, a content of the inorganic fine particles become relatively low, and thus strength of the ceramic layer decreases.

Therefore, the content of the organometallic compound in the ceramic layer ranges preferably from 2 to 50% by weight, and more preferably from 2.5 to 30% by weight.

As the organometallic compound, a polysilazane can be used. A polysilazane used in the present invention is represented by the following general formula (1):

$$(R1R2SiNR3)_n \qquad (1)$$

In the formula (1), R1, R2 and R3 independently represent hydrogen, an alkyl group, an aryl group, a vinyl group, or a cycloalkyl group. At least one of R1, R2 and R3 is hydrogen, and preferably all of R1, R2 and R3 are hydrogen, and "n" represents an integral number ranging from 1 to 60.

A Polysilazane can be in any molecular shape, for example, can be a straight chain or a ring.

A polysilazane represented by the above formula (1) and a reaction accelerating agent as needed are dissolved in an appropriate solvent, and application thereof is performed, and subsequently hardening is performed by heating, excimer light treatment, or UV light treatment. By the above, a ceramic layer having a high heat and light durability can be formed. Especially, hardening by irradiation of UVU radiation including light of wavelength of from 170 to 230 nm (for example, excimer light) followed by heat hardening further enhances a water seepage-preventing effect.

As for the reaction accelerating agent, an acid or a base is suitably used. However, the reaction accelerating agent is not essential.

As for the reaction accelerating agent, such as triethylamine, diethylamine, N,N-dimethylethanolamine, triethanolamine, triethylamine, hydrochloric acid, oxalic acid, fumaric acid, sulfonic acid, acetic acid, and a metal carboxylate salt including a metal such as nickel, iron, palladium, iridium, platinum, titan, or aluminum can be given as the examples. However, the reaction accelerating agent is not limited to the above.

If the reaction accelerating agent is used, a metal carboxylate salt is especially suitable. An amount thereof to be added ranges preferably from 0.01 to 5 mol % on the basis of a polysilazane.

As for the solvent, an aliphatic hydrocarbon, an aromatic hydrocarbon, a halogen hydrocarbon, an ether, or an ester can be used. Methylethylketone, tetrahydrofuran, benzene, toluene, xylene, dimethylfluoride, chloroform, tetrachloromethane, ethylether, isopropylether, dibutylether, or ethylbutylether is suitable.

A concentration of a polysilazane is preferably high. However, because a high concentration causes a shorter period of conserving a polysilazane, a polysilazane is dissolved in a solvent preferably from 5 to 50 wt % by weight).

If a polysilazane solution is used as the ceramic precursor solution, in terms of suppressing deterioration of the glass material or the like used for a substrate, heating temperature in firing (firing temperature) ranges preferably from 150 to 500° C., and more preferably from 150 to 350° C.

(Fluorescent Substance)

The fluorescent substance is excited with a wavelength of light emitted from the LED element 3 (an exciting wavelength), and emits fluorescence of a wavelength different from the exciting wavelength.

In the embodiment, used is a YAG (yttrium.aluminum.garnet) fluorescent substance, which converts blue light (of wavelengths from 420 to 485 nm) emitted from a blue LED element to yellow light (of wavelengths from 550 to 650 nm).

For such a fluorescent substance, oxides of Y, Gd, Ce, Sm, Al, La, or Ga, or compounds that are easily turned into oxides at a high temperature, are used and mixed well in a stoichiometric ratio to obtain a raw mixture. Otherwise, a solution obtained by dissolving Y, Gd, Ce and Sm, which are rare earth elements, in an acid in a stoichiometric ratio is coprecipitated with oxalic acid, and fired to obtain coprecipitated oxide. Subsequently, the coprecipitated oxide is mixed with aluminum oxide and gallium oxide to obtain a raw mixture.

Thereafter, an adequate amount of a fluoride such as ammonium fluoride as a flux is mixed with the obtained raw mixture, and pressure is applied thereto, to obtain compact.

The obtained compact is put in a crucible, and fired at a temperature ranging from 1350 to 1450° C. for from 2 to 5 hours to obtain a sintered compact having a light-emitting characteristics of a fluorescent substance.

Although a YAG fluorescent substance is used in the embodiment, a type of a fluorescent substance to be used is not limited thereto. For example, other fluorescent substance such as a non-garnet fluorescent substance containing no Ce can be used. A larger particle diameter of a fluorescent substance provides a higher light-emitting efficiency (wavelength conversion efficiency), while providing bigger apertures formed around the interface between the organometallic compound and the fluorescent substance and a weaker layer strength of the ceramic layer.

Thus, considering light-emitting efficiency and volume of apertures formed on the interface of the organometallic compound and the fluorescent substance, it is preferable to use a fluorescent substance having an average particle diameter ranging from 1 to 50 µm. The average particle diameter of a fluorescent substance can be measured by, for example, the Coulter Counter Method.

(Layered Silicate Mineral)

The layered silicate mineral is preferably a swelling clay mineral having the micaceous structure, the kaolinite structure, the smectite structure, or the like. The smectite structure, which swells well, is especially suitable. This is because, as described below, water added to the liquid mixture enters into layer gaps of the smectite structure, and swells the structure to form a card house structure. Thus, even an added amount is small, viscosity of the liquid mixture 40 can be much increased.

In addition, because the layered silicate mineral is in a plate-like structure in the ceramic layer, layer strength of the ceramic layer can be enhanced.

If a content of the layered silicate mineral in the ceramic layer is less than 0.5% by weight, an effect for increasing viscosity of the liquid mixture cannot be sufficiently obtained.

On the other hand, if the content of the layered silicate mineral is more than 20% by weight, strength of the ceramic layer after heated decreases.

Thus, the content of the layered silicate mineral ranges preferably from 0.5 to 20% by weight, and more preferably from 0.5 to 10% by weight.

Here, considering affinity of the layered silicate mineral for the organic solvent, a layered silicate mineral whose surface is modified (a surface treatment) with an ammonium salt or the like can also be used as needed.

(Inorganic Fine Particle)

The inorganic fine particles possess a filling effect for filling apertures therewith formed around the surfaces of the fluorescent substance and the layered silicate mineral; a viscosity-increasing effect for increasing viscosity of the liquid mixture before heated; and a layer strength-enhancing effect for enhancing layer strength of the ceramic layer.

As for the inorganic fine particles used in the present invention, oxide fine particles of such as a silicon oxide, a titanium oxide, zinc oxide, and fluoride fine particles of such as magnesium fluoride can be given as the examples. Especially, when an organic compound including silicon such as a polysiloxane is used as the organometallic compound, in terms of stability of the inorganic fine particles to the ceramic layer to be formed, silicon oxide fine particles are suitably used.

If a content of the inorganic fine particles in the ceramic layer is less than 0.5% by weight, each of the above-mentioned effects cannot be sufficiently obtained.

On the other hand, if the content of the inorganic fine particles in the ceramic layer is more than 50% by weight, strength of the ceramic layer after heated decreases.

Thus, the content of the inorganic fine particles in the ceramic layer is set to be from 0.5 to 50% by weight.

Preferably, the content of the inorganic fine particles in the ceramic layer ranges from 0.5 to 40% by weight.

In addition, considering each of the above-mentioned effects, an average particle diameter of the inorganic fine particles ranges preferably from 0.001 to 50 µm, and more preferably from 0.005 to 20 µm.

The average particle diameter of the inorganic fine particles can be measured by, for example, the Coulter Counter Method.

Here, considering affinity of the inorganic fine particles for the organometallic compound and the organic solvent, inorganic fine particles whose surfaces are modified with a silane coupling agent or a titanate coupling agent can also be used as needed.

(Precursor Solution)

The precursor solution is a mixture of the organometallic compound with the organic solvent. By heating the precursor solution, the translucent ceramic layer can be obtained. By heating the liquid mixture prepared by mixing the fluorescent substance, the layered silicate mineral, and the inorganic fine in the precursor solution has been applied, the wavelength conversion portion 6 can be formed.

When water is added to the liquid mixture, water enters into layer gaps of the layered silicate mineral, and thus settlement of the fluorescent substance is suppressed.

If water contains impurities, polymerization of the precursor solution may be suppressed. Thus, it is required that water to be added is purified water containing no impurities.

As for the organic solvent, an alcohol that has a high solubility in water such as methanol, ethanol, propanol, butanol, or the like is suitable.

If a mixture amount of the organometallic compound to the organic solvent is less than 5% by weight, it is difficult to increase viscosity of the liquid mixture. If the mixture amount of the organometallic compound to the organic solvent is more than 50% by weight, polymerization reaction becomes too fast beyond necessity.

Thus, the mixture amount of the organometallic compound to the organic solvent ranges preferably from 5 to 50% by weight, and more preferably from 8 to 40% by weight.

A preparation protocol of the liquid mixture is, for example, if a lipophilic layered silicate mineral whose surface is treated is used, such that the layered silicate mineral is firstly pre-mixed with the solution where the organometallic compound is mixed with the organic solvent (the precursor solution), and subsequently, the fluorescent substance, the inorganic fine particles, and water are mixed therewith.

If a hydrophilic layered silicate mineral whose surface is not treated is used, the layered silicate mineral is pre-mixed with water first, and subsequently, the fluorescent substance, the inorganic fine particles, and the precursor solution are mixed therewith.

By the above, the layered silicate mineral can be evenly mixed, and the viscosity-increasing effect can be much enhanced. A preferred viscosity of the liquid mixture ranges from 25 to 800 cP, and the most preferred viscosity ranges from 30 to 500 cP.

When water is added to the organic solvent, a proportion of water to the total amount of the solvent is set be 5% or more by weight. If the proportion of water is less than 5% by weight, the viscosity-increasing effect mentioned above is not sufficiently obtained. If the proportion of water is more than 60% by weight, the viscosity-increasing effect is surpassed by a viscosity-decreasing effect resulted from addition of excess water.

Thus, the proportion of water to the total solvent ranges preferably from 5 to 60% by weight, and more preferably from 7 to 55% by weight.

A most preferred composition of the liquid mixture is such that a polysiloxane is used as the organometallic compound. A most preferred composition range of each above-mentioned material in the liquid mixture is from 35 to 65% a polysiloxane dispersion liquid, from 0.1 to 5% the layered silicate mineral, from 1 to 40% the inorganic particles, and from 5 to 50% water by weight.

Here, as for the layered silicate mineral, a layered silicate mineral having the smectite structure, which has high affinity for polysiloxane, is preferably used.

Next, a method of manufacturing a light-emitting device 100 (a wavelength conversion portion 6) will be described.

Figure 2:
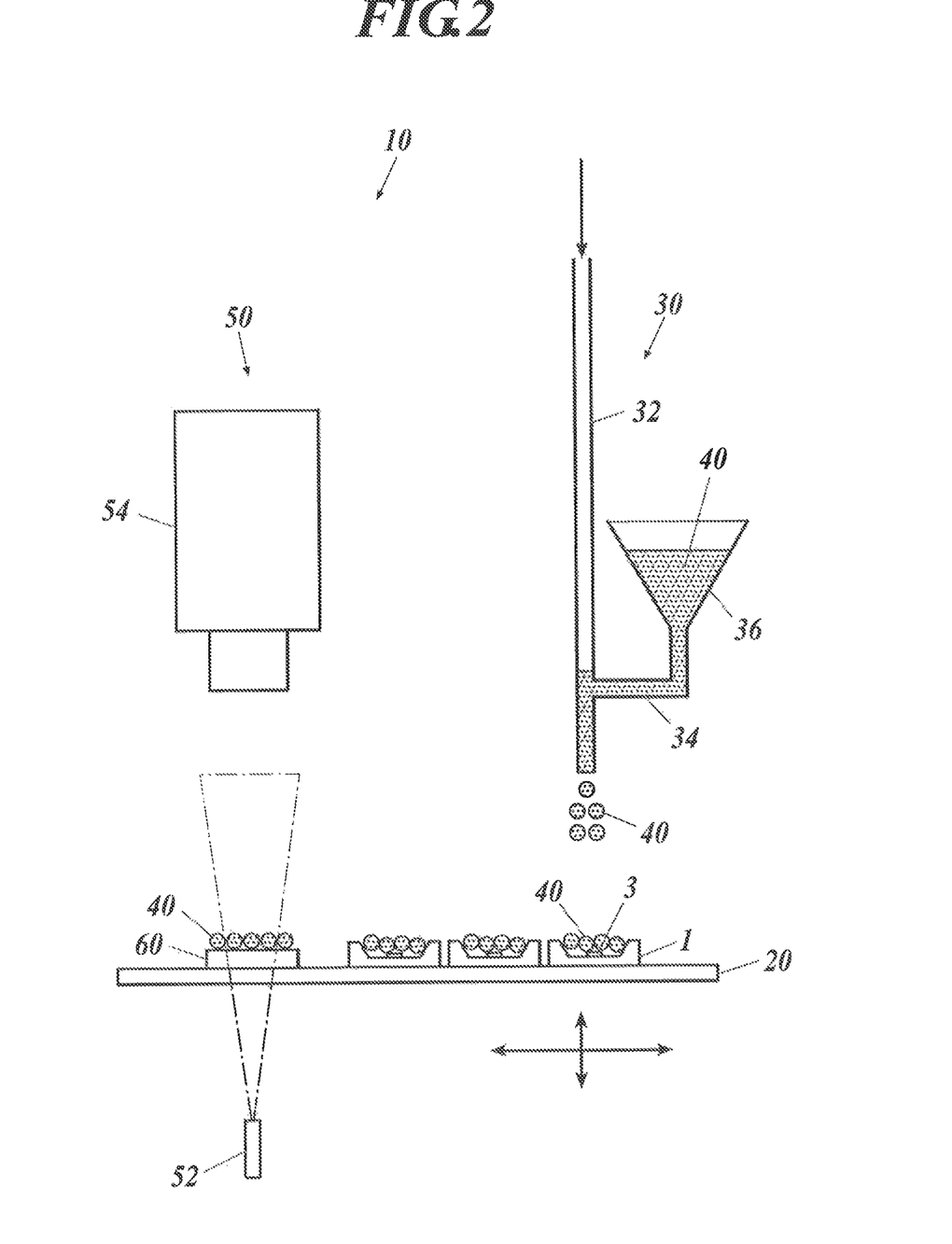
FIG. 2 This is a schematic diagram for explaining schematically a manufacturing device and a manufacturing method of a light-emitting device.

To manufacture the wavelength conversion portion 6 of the light-emitting device 100, for example, a manufacturing device 10 of FIG. 2 is used.

The manufacturing device 10 principally includes: a movable carriage 20 which can be moved upward, downward, leftward, rightward, forward and backward; a spraying unit 30 which can spray the above-described liquid mixture (40); and an inspecting unit 50 which can inspect such as chromaticity and brightness of the wavelength conversion portion 6.

The spraying unit 30 is arranged above the movable carriage 20.

The spraying unit 30 has a nozzle 32 to which air is supplied.

Here, the spraying unit 30 can be arranged below the movable carriage 20 and can spray the liquid mixture 40 upwards.

A pore diameter of the tip of the nozzle 32 ranges from 20 μm to 2 mm, and preferably from 0.1 to 0.3 mm. The nozzle 32 can be moved upward, downward, leftward, rightward, forward and backward like the movable carriage 20. Particularly, an angle of the nozzle 32 can also be adjusted, and thus the nozzle 32 can be inclined with respect to the movable carriage 20 (or with respect to the LED substrate 1 to be put thereon).

The nozzle 32 has a built-in temperature adjusting system, and thus temperatures of materials to be sprayed can be adjusted.

The nozzle 32 is connected to a tank 36 through a connecting pipe 34.

The tank 36 pools the liquid mixture 40. The tank 36 has a stirring bar therein, and the liquid mixture 40 is continuously stirred. By stirring the liquid mixture 40, settlement of the fluorescent substance having a high specific gravity may be suppressed, and thus, the fluorescent substance can be kept in a dispersed state in the liquid mixture 40.

Here, as for the spraying unit 30, instead of supplying air to the nozzle 32, there is an adoptable mechanism such that pressure is supplied directly to the liquid mixture 40 in the tank 36 using such as a motor as a driver to spray the liquid mixture 40, or to push the liquid mixture 40 out from the nozzle 32. When the mechanism for pushing the liquid mixture 40 out is adopted, unevenness of the pressure supplied to the liquid mixture 40 is set to be 10% or less.

The inspecting unit 50 has an LED element 52 and a luminance colorimeter 54.

The LED element 52 is an element which emits the same type of light as the LED element 3.

The luminance colorimeter 54 is a measuring instrument for measuring chromaticity and brightness of received light.

In practical manufacturing of the light-emitting device 100, the liquid mixture 40 is sprayed to be applied in advance on a glass plate 60 for adjusting chromaticity and brightness (for a test use) to measure chromaticity and brightness of the white light beforehand (pre-spraying and applying step).

In detail, the glass plate 60 is put on the movable carriage 20, and the movable carriage 20 and the nozzle 32 of the spraying unit 30 is adjusted such that the glass plate 60 and the tip of the nozzle 32 face each other. Thereafter, the liquid mixture 40 is sprayed from the nozzle 32 and applied on the glass plate 60. Subsequently, the glass plate 60 on which the liquid mixture 40 has been applied is moved near the inspecting unit 50, and the light-emitting element 52 is made emit light. Thereafter, chromaticity and brightness of the white light is measured with the luminance colorimeter 54 to confirm if chromaticity and brightness of the white light meet a desired value (a desired range).

The process of the pre-spraying and applying step is repeated until chromaticity and brightness of the white light become stabilized.

In the pre-spraying and applying step, if the chromaticity and brightness of the white light do not meet a desired value, such as spraying pressure and concentration of the fluorescent substance in the liquid mixture 40 can be adjusted to make chromaticity and brightness of the white light meet a desired value. Preferably, this adjustment is performed automatically according to the measured values. However, the adjustment can be performed manually according to the measured values.

Thereafter, in the place of the glass plate 60, a plurality of the LED substrates 1 (on which the LED elements 3 have been disposed in advance) are put on the movable carriage 20, and a positional relationship between the LED substrate 1 and the nozzle 32 of the spraying unit 30 is adjusted (a position adjusting step).

In detail, as same as the arrangement of the glass plate 60, the LED substrates 1 are put on the movable carriage 20, and the LED substrate 1 and the tip of the nozzle 32 are positioned to face each other. The distance between the LED substrate 1 and the tip of the nozzle 32 is set to be from 5 to 30 cm. To evenly apply the liquid mixture 40 on the LED element 3, it is preferable that the tip of the nozzle 32 is apart from the LED substrate 1 at a fixed distance therebetween.

Thereafter, while the LED substrate 1 and the nozzle 32 are moved relative to each other, the liquid mixture 40 is sprayed from the nozzle 32 to be applied on the LED substrate 1 (a spraying and applying step).

In detail, on one hand, the movable carriage 20 and the nozzle 32 are moved such that the LED substrate 1 and the nozzle 32 are moved forward, backward, leftward and rightward. Otherwise, either of the movable carriage 20 or the nozzle 32 can be fixed and the other can be moved forward, backward, leftward and rightward. There is also another method of application preferably used involving arranging a plurality of the LED elements 3 to be in a direction which is at the right angle to the direction in which the movable carriage 20 is moved, and performing the spraying while the nozzle 32 is moved in a direction which is at the right angle to the direction in which the movable carriage 20 is moved. Meanwhile, air is supplied to the nozzle 32 to spray the liquid mixture 40 from the tip of the nozzle 32 to the LED substrate 1.

In the spraying and applying step, the following operations (1)-(9), condition settings, and the like are performed.

(1) Basically, the tip of the nozzle 32 is arranged right above the LED substrate 1, and the liquid mixture 40 is sprayed from right above the LED element 3.

Here, because the LED element 3 is in a cuboid shape, in addition to or instead of spraying the liquid mixture 40 from right above the LED element 3, for example, the nozzle 32 can be tilted to spray the liquid mixture 40 from diagonal directions with respect to four corners of the LED element 3.

When the liquid mixture 40 is sprayed from the four diagonal directions at small spraying angles as described above, the liquid mixture 40 can also be applied evenly on the side faces of the LED element 3.

The spraying angle of the nozzle 32 can be set adequately as needed. Preferably, the spraying angle is 45°.

(2) Spraying volume of the liquid mixture 40 is fixed so as to fix an amount of the fluorescent substance per unit area. A time-dependent unevenness of spraying volume of the liquid mixture 40 is within 10%, and preferably within 1%.

(3) Temperature adjustment is performed on the nozzle 32 to adjust viscosity of the liquid mixture 40 when sprayed. Preferably, the temperature of the liquid mixture 40 is adjusted to 40° C. or less, or adjusted according to viscosity of the liquid mixture 40.

In this case, the LED substrate 1 can be put in room temperatures. Otherwise, a temperature adjusting system can be equipped with the movable carriage 20 to adjust the temperature of the LED substrate 1.

If the temperature of the LED substrate 1 is set to a high temperature ranging from 30 to 100° C., the organic solvent in the liquid mixture 40 which has been sprayed on the LED substrate 1 can volatilize rapidly. Thus, the liquid mixture 40 can be prevented from dropping from the LED substrate 1. On the contrary, if the temperature of the LED substrate 1 is set to a low temperature ranging from 5 to 20° C., the solvent can volatilize slowly. Thus, the liquid mixture 40 can be applied evenly along the outer faces of the LED element 3, and further, layer density and layer strength of the wavelength conversion portion 6 can be increased, and a fine layer can be formed.

(4) An environmental atmosphere (temperature and humidity) is fixed to stabilize the spraying of the liquid mixture 40.

Especially, when a polysilazane is used as the organometallic compound, the liquid mixture 40 itself may become solidified because a polysilazane has hygroscopicity. Thus, preferably, temperature is lowered when the liquid mixture 40 is sprayed.

(5) Between the spraying unit 30 and the LED substrate 1, a mask formed according to a shape of the LED element 3 is arranged, and the liquid mixture 40 is sprayed to pass through the mask.

As for the mask, it is required that a material for the mask is not dissolved in the organic solvent of the liquid mixture 40. Preferably, in terms of recovering materials attached on the mask such as the fluorescent substance, the material for the mask is flammable.

(6) After the spraying and applying of the liquid mixture 40 on one of the LED substrates 1 is completed, the same operations as described above are performed on another LED substrate 1. The liquid mixture 40 is sequentially sprayed to be applied on the LED elements 3 arranged on the plurality of the LED substrates 1.

In this case, the liquid mixture 40 can be sprayed continuously regardless of the replacement of the LED substrates 1. Otherwise, the spraying of the liquid mixture 40 can be stopped at every timing of replacing the LED substrates 1 with one another, to spray the liquid mixture 40 intermittently. If the liquid mixture 40 is sprayed continuously, spraying volume of the liquid mixture 40 to the LED substrates 1 can be stabilized. When the liquid mixture 40 is sprayed intermittently, consumed amount of the liquid mixture 40 can be saved.

(7) During the spraying and applying step, every timing of completing the spraying and applying of the liquid mixture 40 on a predetermined number of the LED substrates 1, chromaticity and brightness of the white light can be inspected in practice. Obtained results from the inspection can be used as feedback for adjusting such as spraying volume, spraying pressure, spraying temperature (temperature of the nozzle 32) of the liquid mixture 40 (an inspecting step).

That is, in the inspecting step, one of the LED substrates 1 on which the liquid mixture 40 has been sprayed and applied is moved near the inspecting unit 50, and the LED element 3 is made emit light. Thereafter, chromaticity and brightness of the white light are measured with the luminance colorimeter 54, and according to the measured results, such as spraying volume, spraying pressure, spraying temperature (temperature of the nozzle 32) of the liquid mixture 40 can be adjusted.

Instead of using the LED substrate 1 on which the liquid mixture 40 has been sprayed and applied, the liquid mixture 40 can be sprayed to be applied on the glass plate 60 to use it for inspecting chromaticity and brightness of the white light. When the glass pate 60 is used, the LED element 52 is made emit light and chromaticity and brightness of the white light is measured.

(8) During the spraying and applying step, the nozzle 32 can be cleaned.

In this case, a cleaning tank for pooling a cleaning solution is arranged near the spraying unit 30, and the tip of the nozzle 32 is dipped in the cleaning tank when, for example, the spraying of the liquid mixture 40 is stopped or chromaticity and brightness of the white light are being inspected, to prevent the tip portion of the nozzle 32 from being dried.

As for the cleaning solution, a solution capable of dissolving the liquid mixture 40 can be used.

In addition, when the spraying and applying step is stopped, the liquid mixture 40 may harden to plug an spraying exit of the nozzle 32. Thus, it is preferable to dip the nozzle 32 in the cleaning tank, or to clean the nozzle 32 at the start of the spraying and applying step.

Here, the cleaning of the nozzle 32 can be performed before performance of the spraying and applying step itself.

(9) In the spraying and applying step, the liquid mixture 40 is sprayed in mists. Thus, when the organic solvent in the liquid mixture 40 volatilizes, powder such as the fluorescent substance and the inorganic fine particles may be splattered. Thus, preferably, the whole manufacturing device 10 is encased with, for example, a housing so as to perform dust collection and exhaust ventilation through a filter during performance of the spraying and applying step or the inspecting step.

If the fluorescent substance is collected with the filter, the fluorescent substance, which is expensive, can be reused.

After the above, the LED substrate 1 on which the liquid mixture 40 has been applied is moved to a sintering furnace to be fired (a firing step).

In the firing step, a treating temperature (a firing temperature) is set to a extent that the LED element 3 is not broken, ranging from 100 to 300° C., preferably from 130 to 170° C., more preferably from 140 to 160° C., and most preferably around 150° C.

As a result, the liquid mixture 40 is sintered and the wavelength conversion portion 6 is manufactured (formed).

Here, after the liquid mixture 40 is sintered, the top of the wavelength conversion portion 6 can be sealed with a silicone resin with a dispenser. In this case, time-dependent deterioration of the wavelength conversion portion 6 can be suppressed, and adhesion properties of the wavelength conversion portion 6 to the LED substrate 1 and the LED element 3 can be enhanced.

According to the above embodiment, the liquid mixture 40 containing the fluorescent substance is sprayed and applied on the LED element 3, the fluorescent substance can be applied on the LED element 3 in an evenly-dispersed state, and thus the wavelength conversion portion 6 where the fluorescent substance is evenly dispersed in the ceramic layer having a high heat durability can be formed.

Here, in the embodiment, the use of one nozzle 32 is exemplary described. However, the number of the nozzles can be three or more (can be modified) according to types of materials to be sprayed.

For example, in the case where fluorescent substances each of which emits red (R), blue (B), or yellow (Y) light respectively are used to emit white light by mixing these three types of lights, three spraying units which are the same as the spraying unit 30 can be used to spray solutions each of which contains each fluorescent substance from three nozzles separately.

Examples

Hereinafter, the light-emitting device 100 of the present invention will be illustrated with reference to Examples and Comparative Examples in further detail.

(1) Preparation of Samples
(1.1) Preparation of Fluorescent Substance
As the raw materials, 7.41 g of $Y_2O_3$, 4.01 g of $Gd_2O_3$, 0.63 g of $CeO_2$, and 7.77 g of $Al_2O_3$ were well mixed, and an adequate amount of ammonium fluoride as a flux was added therewith. Then, this mixture was put in an aluminum crucible and fired under a reducing atmosphere by ventilating nitrogen gas with hydrogen gas at a temperature ranging from 1350 to 1450° C. for from 2 to 5 hours to obtain a fired product $((Y_{0.72}Gd_{0.24})_3Al_5O_{12}:Ce_{0.04})$.

The obtained fired product was milled, washed, separated, and dried to obtain yellow fluorescent substance particles having an average particle diameter of about 10 μm. Thereafter, an emission wavelength of an excitation light of the fluorescent substance particles at a wavelength of 465 nm was measured, and a peak wavelength was at about 570 nm.

(1.2) Preparation of a Liquid Mixture (Precursor Solution)
(1.2.1) Preparation of Liquid Mixture 1
First, 0.02 g of lipophilic smectite whose surface was treated (Lucentite SPN, Co-op Chemical Co., Ltd.) was mixed with and dispersed in 1 g of a polysiloxane dispersion liquid (14% polysiloxane and 86% isopropyl alcohol by weight). Then, 1.1 g of the above-prepared fluorescent substance particles, 0.03 g of silicon oxide fine particles having a median diameter (D50) of 25 nm (NanoTek Powder, CIK NanoTek Corporation), and 0.38 g of purified water were mixed with the above dispersion liquid to prepare "Liquid mixture 1-1".

Mixture amounts of the polysiloxane, the smectite, the fluorescent substance, and silicon oxide fine particles were determined such that the sum of them in the ceramic layer after polymerization by heating was 100% by weight (the same was applied to the below-described Lquid mixtures 1-2, 1-3, 2-1, and 2-2).

(1.2.2) Preparation of Liquid Mixture 1-2
First, 0.01 g of lipophilic smectite whose surface was treated (Lucentite SPN, Co-op Chemical Co., Ltd.) was mixed with and dispersed in 1 g of a polysiloxane dispersion liquid (14% polysiloxane and 86% isopropyl alcohol by weight). Then, 0.7 g of the above-prepared fluorescent substance particles, 0.03 g of silicon oxide fine particles having a median diameter (D50) of 3 μm and a particle size variation of from 1 to 24 μm (Hi-Silica F3, NITCHITSU CO., LTD.), and 0.07 g of purified water were mixed with the above dispersion liquid to prepare "Liquid mixture 1-2".

(1.2.3) Preparation of Liquid Mixture 1-3
As for the preparation of Liquid mixture 1-1, a mixture amount of the fluorescent substance particles was changed to 0.9 g, and a mixture amount of the silicon oxide fine particles having a median diameter (D50) of 25 nm (NanoTek Powder, CIK NanoTek Corporation) was changed to 0.2 g.

"Liquid mixture 1-3" was prepared by the same method Liquid mixture 1-1 except for the above.

(1.2.4) Preparation of Liquid Mixture 2-1
To prepare "Liquid mixture 2-1", 0.3 g of the above-prepared fluorescent substance particles were mixed with 1 g of a polysiloxane dispersion liquid (14% polysiloxane and 86% isopropyl alcohol by weight).

(1.2.5) Liquid Mixture 2-2
To prepare "Liquid mixture 2-2", 0.6 g of the above-prepared fluorescent substance particles and 0.03 g of the silicon oxide fine particles having a median diameter (D50) of 25 nm (NanoTek Powder, CIK NanoTek Corporation) were mixed with 1 g of a polysiloxane dispersion liquid (14% polysiloxane and 86% isopropyl alcohol by weight).

Data of compositions of Liquid mixtures 1-1 to 1-3, 2-1 and 1-2 are shown in Table 1. In Table 1, "*" denotes a proportion of water to the total solvent amount (the total amount of the solvents: the sum of the organic solvent and water).

TABLE 1

| COMPOSITION | | LIQUID MIXTURE 1-1 (EXAMPLE1) | LIQUID MIXTURE 1-2 (EXAMPLE2) | LIQUID MIXTURE 1-3 (EXAMPLE3) | LIQUID MIXTURE 2-1 (COMPARATIVE EXAMPLE1) | LIQUID MIXTURE 2-2 (COMPARATIVE EXAMPLE2) |
|---|---|---|---|---|---|---|
| ORGANOMETALLIC COMPOUND/ POLYSILOXANE | | 6.4 | 9.4 | 6.4 | 20.4 | 10.9 |
| FLUORESCENT SUBSTANCE | | 89.6 | 85.7 | 75.2 | 79.6 | 84.9 |
| LAYERED SILICATE MINERAL/ LIPOPHILIC SMECTITE | | 1.6 | 1.2 | 1.7 | — | — |
| INORGANIC PARTICLE | NANO SILICA (NanoTek Powder) | 2.4 | — | 16.7 | — | 4.2 |
| | HI-SILICA (F3) | — | 3.7 | — | — | — |
| SUM | | 100 | 100 | 100 | 100 | 100 |
| WATER (*) | | 30.6 | 10.4 | 30.6 | — | — |

(1.3) Preparation of Wavelength Conversion Portions

Viscosities of Liquid mixtures 1-1 to 1-3, 2-1 and 2-2 were measured with a vibrational viscometer (VM-10A-L, CBC Co., Ltd.).

On an LED substrate on which 20 blue LED chips have been disposed in advance, Liquid mixture 1-1 was sprayed so as to form a ceramic layer having a thickness of 35 μm after heated; Liquid mixtures 1-2 and 2-2 were sprayed so as to form ceramic layers having a thickness of 40 μm after heated; and Liquid mixtures 1-3 and 2-1 were sprayed so as to form ceramic layers having a thickness of 45 μm after heated. Thereafter, heating was performed at 150° C. for 60 minutes to prepare ceramic layers (wavelength conversion portions).

By the above treatments, five sample pieces (sheets) of a light-emitting device for each Liquid mixtures 1-1 to 1-3, 2-1 and 2-2 were prepared.

In particular, the light-emitting devices prepared by using Liquid mixtures 1-1 to 1-3 to prepare the wavelength conversion portions were named as the Samples of "Example 1" to "Example 3" respectively, and the light-emitting devices prepared by using Liquid mixtures 2-1 and 2-2 to prepare the wavelength conversion portions were determined as the Samples of "Comparative Example 1" and "Comparative Example 2" respectively.

(2) Evaluation of Capability of Samples (2.1) Evaluation of Layer Thickness of the Wavelength Conversion Portion Layer thicknesses in each Sample were measured with a laser hologage manufactured by Mitutoyo Corporation, and a variation of the layer thicknesses was evaluated.

An evaluation result is shown in Table 2.

Table 2 also shows viscosities of Liquid mixtures.

Regarding the evaluation of the layer thickness shown in Table 2, an average of layer thicknesses on the LED chips of one sample piece on which the applying was firstly performed among the five sample pieces of the Sample was determined as a standard thickness (100%). If a variation of each average of the layer thicknesses on the LED chips of the other four pieces of the Sample to the standard thickness was within ±10%, it was evaluated as "⊚ (double circle)"; if within ±20%, evaluated as "o (circle)"; if within ±30%, eveluated as "Δ (triangle)"; and if exceeded ±40%, evaluated as "x (cross)".

(2.2) Measurement of Chromaticity

The LED chips of each Sample were made emit light, and chromaticity of the emitted light was measured with a spectroradiometer (CS-1000A, Konica Minolta Sensing Inc.).

A measurement result is shown in Table 2.

Chromaticity is defined by an intersection at which a straight line connecting a certain point and the origin intersects the plane x+y+z=1, in the CIE-XYZ color coordinate system representing a color space by the XYZ coordinates. Here, chromaticity is defined by the XY coordinates, and a Z coordinate obtained according to a relationship of x+y+z=1 is omitted.

Chromaticity of white light is (0.33, 0.33). When chromaticity of light is closer to these values, the light is closer to white light. When a value of the X coordinate is small, a color of the light is bluish white. When a value of the X coordinate is large, a color of the light is yellowish white.

Each of five chromaticities in Table 2 represents chromaticity of the respective five sample pieces. The each value of the sample piece is an average of three chromaticities obtained by measuring lights emitted from three LED chips which were arbitrarily selected among the plurality of LED chips on each of the LED substrate.

TABLE 2

| SAMPLE | VISCOSITY [cP] | VARIATION OF LAYER THICKNESSES | CHROMATICITY [X-COORDINATE, Y-COORDINATE] |
|---|---|---|---|
| EXAMPLE 1 | 68 | ⊚ | (0.33, 0.34) (0.32, 0.33) (0.32, 0.32) (0.34, 0.34) (0.34, 0.35) |
| EXAMPLE 2 | 32 | ⊚ | (0.33, 0.35) (0.34, 0.34) (0.33, 0.34) (0.32, 0.32) (0.34, 0.34) |
| EXAMPLE 3 | 74 | ⊚ | (0.33, 0.34) (0.33, 0.34) (0.32, 0.33) (0.34, 0.34) (0.33, 0.35) |
| COMPARATIVE EXAMPLE 1 | 4 | X | (0.24, 0.21) (0.26, 0.24) (0.27, 0.25) (0.36, 0.36) (0.35, 0.35) |
| COMPARATIVE EXAMPLE 2 | 12 | Δ | (0.31, 0.32) (0.33, 0.34) (0.32, 0.32) (0.34, 0.34) (0.36, 0.37) |

(2.3) Heat Shock Test and Evaluation of Exfoliation

Each Sample of Examples 1 and 3 and Comparative Example 2 was subjected to a heat shock test to evaluate exfoliation state of each wavelength conversion portion.

Specifically, each Sample was subjected to a treatment for 100 cycles determining that one cycle of the treatment was to allow the Sample to stand at −40° C. for 30 minutes and subsequently at 100° C. for 30 minutes by using TSA-71S-A manufactured by ESPEC CORP.

Thereafter, Cellotape™ manufactured by Nichiban Co., Ltd. was put on the wavelength conversion portions (ceramic layers) formed on the surfaces of the LED substrates of each Sample after the heat shock test to exfoliate the wavelength conversion portions. Then, the exfoliation state was evaluated.

In Table 3, the basis of evaluation as "⊚ (double circle)", "o (circle)", "Δ (triangle)", and "x (cross)" are as follows.

"⊚ (double circle)": No exfoliation was observed in all of the five light-emitting devices.

"o (circle)": Exfoliation was observed in one of the five sample pieces.

"Δ (triangle)": Exfoliation was observed in two of the five sample pieces.

"x (cross)": Exfoliation was observed in three or more of the five sample pieces.

TABLE 3

| SAMPLE | EXFOLIATION STATE |
| --- | --- |
| EXAMPLE 1 | ⊚ |
| EXAMPLE 3 | ⊚ |
| COMPARATIVE EXAMPLE 2 | X |

(3) Conclusion

As evident from Table 2, in the Samples of Examples 1-3 prepared by using a polysiloxane as the organometallic compound in the precursor solution and adding the fluorescent substance, the smectite, the silicon oxide particles, and purified water to that precursor solution, viscosities of Liquid mixtures were high, namely, from 32 to 74 cP. In addition, the variation of the layer thicknesses of the wavelength conversion portions was within ±10%, and the variation of the chromaticities was small. This is because settlement of the fluorescent substance was suppressed by the viscosity-increasing effect of the silicon oxide fine particles which increased viscosities of Liquid mixtures 1-1 to 1-3 (the precursor solutions).

In contrast, in the Sample of Comparative Example 1 prepared without adding the smectite, the silicon oxide fine particles and purified water to the liquid mixture, and in the Sample of Comparative Example 2 prepared without adding the smectite and purified water, viscosities of Liquid mixtures were low, namely, from 4 to 12 cP. Accordingly, settlement of the fluorescent substance was easily occurred, and thus the variation of the layer thicknesses of the wavelength conversion portions exceeded ±20%.

In addition, as evident from Table 3, in the Samples of Examples 1-3 prepared by using a polysiloxane as the organometallic compound in the precursor solution and adding the fluorescent substance, the smectite, the silicon oxide fine particles and purified water to that precursor solution, no exfoliation was observed, and thus it is confirmed that layer strength is sufficiently achieved.

In contrast, in the Sample of Comparative Example 2 prepared without adding the layer silicate mineral, exfoliation was observed in more than 2 light-emitting devices.

INDUSTRIAL APPLICABILITY

The present invention is suitably applicable to a method of manufacturing a light-emitting device for dispersing a fluorescent substance evenly in a translucent material having a high heat durability.

EXPLANATION OF REFERENCE NUMERALS

1 LED substrate
2 metal portion
3 LED element
4 projecting electrode (bump)
6 wavelength conversion portion
10 manufacturing device
20 movable carriage
30 spraying unit
32 nozzle
34 connecting pipe
36 tank
40 liquid mixture
50 inspecting unit
52 LED element
54 luminance colorimeter
60 glass plate
100 light-emitting device

The invention claimed is:

1. A method of manufacturing a light-emitting device comprising a light-emitting element which emits light of a predetermined wavelength and a wavelength conversion portion comprising a fluorescent substance which is excited by the light emitted from the light-emitting element to emit fluorescence of a wavelength different from the predetermined wavelength, the method comprising:

spraying so as to apply a liquid mixture containing the fluorescent substance, a layered silicate mineral, an organometallic compound and inorganic fine particles which are not formed from the organometallic compound on the light-emitting element from a nozzle while the nozzle is moved relative to the light-emitting element; and forming the wavelength conversion portion by heating the sprayed and applied liquid mixture.

2. The method of manufacturing the light-emitting device according to claim 1 comprising cleaning the nozzle before the spraying so as to apply the liquid mixture on the light-emitting element from the nozzle.

3. The method of manufacturing the light-emitting device according to claim 1, wherein, in the spraying so as to apply the liquid mixture on the light-emitting element from the nozzle, the spraying the liquid mixture is stopped intermittently and a tip of the nozzle is dipped in a cleaning solution during the intermittence.

4. The method of manufacturing the light-emitting device according to claim 1 further comprising, before the spraying so as to apply the liquid mixture on the light-emitting element from the nozzle, spraying so as to apply the liquid mixture on a glass plate for adjusting chromaticity and brightness, and measuring the chromaticity and brightness of the glass plate.

5. The method of manufacturing the light-emitting device according to claim 1, wherein, in the spraying so as to apply the liquid mixture on the light-emitting element from the nozzle, the nozzle is tilted to spray the liquid mixture from a diagonal direction with respect to the light-emitting element.

6. A method of manufacturing a light-emitting device comprising a light-emitting element which emits light of a predetermined wavelength and a wavelength conversion portion comprising a fluorescent substance which is excited by the light emitted from the light-emitting element to emit fluorescence of a wavelength different from the predetermined wavelength, the method comprising:

applying a liquid mixture containing the fluorescent substance, a layered silicate mineral, an organometallic compound and inorganic fine particles which are not formed from the organometallic compound on the light-emitting element; and forming the wavelength conversion portion by heating the applied liquid mixture.

7. The method of manufacturing the light-emitting device according to claim 6, wherein
the liquid mixture contains purified water.

8. The method of manufacturing the light-emitting device according to claim 6, wherein
a nozzle is used to apply the liquid mixture in the applying the liquid mixture on the light-emitting element.

9. The method of manufacturing the light-emitting device according to claim 8, wherein
the nozzle is moved relative to the light-emitting element in the applying the liquid mixture on the light-emitting element.

10. The method of manufacturing the light-emitting device according to claim 8, wherein
the applying the liquid mixture on the light-emitting element is spraying the liquid mixture from the nozzle so as to apply the liquid mixture on the light-emitting element.

11. The method of manufacturing the light-emitting device according to claim 8, wherein
the applying the liquid mixture on the light-emitting element is pushing the liquid mixture out from the nozzle so as to apply the liquid mixture on the light-emitting element.

12. The method of manufacturing the light-emitting device according to claim 8 comprising cleaning the nozzle before the applying the liquid mixture on the light-emitting element.

13. The method of manufacturing the light-emitting device according to claim 8, wherein, in the applying the liquid mixture on the light-emitting element, the application of the liquid mixture is stopped intermittently and a tip of the nozzle is dipped in a cleaning solution during the intermittence.

14. The method of manufacturing the light-emitting device according to claim 6 further comprising, before the applying the liquid mixture on the light-emitting element, applying the liquid mixture on a glass plate for adjusting chromaticity and brightness, and measuring the chromaticity and brightness of the glass plate.

15. The method of manufacturing the light-emitting device according to claim 8, wherein, in the applying the liquid mixture on the light-emitting element, the nozzle is tilted to apply the liquid mixture from a diagonal direction with respect to the light-emitting element.

16. The method of manufacturing the light-emitting device according to claim 1, wherein the liquid mixture contains the layered silicate mineral in an amount of from 0.1 to 5% by weight, and the liquid mixture contains the inorganic particles in an amount of from 1 to 40% by weight.

17. The method of manufacturing the light-emitting device according to claim 6, wherein the liquid mixture contains the layered silicate mineral in an amount of from 0.1 to 5% by weight, and the liquid mixture contains the inorganic particles in an amount of from 1 to 40% by weight.

* * * * *